(12) United States Patent
Nakatsuji et al.

(10) Patent No.: US 7,076,230 B2
(45) Date of Patent: Jul. 11, 2006

(54) RADIO FREQUENCY APPARATUS

(75) Inventors: Koji Nakatsuji, Gifu (JP); Hiroyuki Yamada, Gifu (JP); Hiromasa Asano, deceased, late of Aichi (JP); by Noriko Asano, legal representative, Aichi (JP); Masanori Suzuki, Aichi (JP); Atsuhito Terao, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 502 days.

(21) Appl. No.: 10/686,067

(22) Filed: Oct. 15, 2003

(65) Prior Publication Data

US 2004/0121811 A1 Jun. 24, 2004

(30) Foreign Application Priority Data

Oct. 16, 2002 (JP) ............................. 2002-301608

(51) Int. Cl.
*H04B 1/10* (2006.01)
*H05K 7/14* (2006.01)
*H05K 9/00* (2006.01)

(52) U.S. Cl. .................. 455/300; 455/301; 455/575.1; 361/800; 361/816; 174/35 R

(58) Field of Classification Search ................ 455/300, 455/301, 575.1, 90.3; 361/760, 761, 782, 361/783, 800, 816; 174/32, 35 R
See application file for complete search history.

(56) References Cited

U.S. PATENT DOCUMENTS

| | | | |
|---|---|---|---|
| 3,610,971 A | * | 10/1971 | Hooper ...................... 310/10 |
| 3,909,726 A | | 9/1975 | Dobrovolny et al. |
| 4,494,095 A | * | 1/1985 | Noji et al. .................... 334/85 |
| 5,014,160 A | * | 5/1991 | McCoy, Jr. ................. 361/818 |
| 5,365,410 A | | 11/1994 | Lonka |
| 5,603,103 A | * | 2/1997 | Halttunen et al. ........ 455/575.1 |
| 5,763,824 A | * | 6/1998 | King et al. ................ 174/35 R |
| 6,093,888 A | * | 7/2000 | Laureanti et al. ......... 174/35 R |
| 6,192,577 B1 | * | 2/2001 | Larsson ....................... 29/840 |
| 6,275,683 B1 | * | 8/2001 | Smith ....................... 455/575.1 |
| 6,483,719 B1 | * | 11/2002 | Bachman .................... 361/816 |
| 6,930,891 B1 | * | 8/2005 | Hama et al. ................ 361/800 |
| 2004/0130666 A1 | * | 7/2004 | Suzuki et al. ............... 348/725 |

FOREIGN PATENT DOCUMENTS

| | | |
|---|---|---|
| EP | 0 866 648 A1 | 9/1998 |
| EP | 1 182 916 A2 | 2/2002 |
| JP | 07-297682 * | 11/1995 |
| JP | 8-37474 | 2/1996 |

OTHER PUBLICATIONS

European Search Report for EP 03 02 3519, dated May 30, 2005.

* cited by examiner

*Primary Examiner*—Duc M. Nguyen
(74) *Attorney, Agent, or Firm*—RatnerPrestia

(57) ABSTRACT

A radio frequency apparatus comprising a printed circuit board mounting an electronic component including a coil as an inductance element, a metal frame body covering this printed circuit board and connected to the ground, a lid formed integrally with the frame body, covering the inductance element mounting side of the frame body, and a leg formed by cutting and bending from the lid, having a width nearly same as the width of the coil, in which the leg is disposed closely to the coil.

15 Claims, 7 Drawing Sheets

RADIO FREQUENCY APPARATUS

BACKGROUND OF THE INVENTION

1. Field of the Invention

The present invention relates to a radio frequency apparatus formed of electronic circuits including an inductance element.

2. Description of the Related Art

A conventional radio frequency apparatus is described below while referring to the drawings. FIG. 5 is a side sectional view of the conventional radio frequency apparatus. FIG. 6 is its top view, and FIG. 7 is a top view of a shield case thereof.

In FIG. 5 to FIG. 7, an electronic component 2 is mounted on one side 1*a* of a printed circuit board 1, and the electronic component 2 is connected to the printed circuit board 1 by cream solder. A coil 3 is mounted on other side 1*b* of the printed circuit board 1. Leads 3*a* of the coil 3 are inserted into holes provided in the printed circuit board 1, and connected to the printed circuit board 1 by soldering. The printed circuit board 1 preliminarily mounting the electronic component 2 and coil 3 is fitted to a shield case 4, and the printed circuit board 1 and a frame body 4*a* forming the outer circumference of the shield case 4 are connected by soldering. The shield case 4 has partition boards 5 formed nearly in the overall width of the frame body 4*a* as shown in FIG. 7. The partition boards 5 are coupled with the frame body 4*a* by thin coupling members 6 provided at both ends.

A slight gap 7 is formed between the partition boards 5 and frame body 4*a* for the ease of folding of the partition boards 5.

The coil 3 side opening of the frame body is provided so as to be covered with a front cover 8. This front cover 8 has an elastic piece 10 raised and formed from the front cover 8, and this elastic piece 10 is formed at a position contacting with a contact piece 9 formed on the partition board 5. Above the coil 3, the front cover 8 has a hole 11 so as to adjust the coil 3.

On the other hand, a back cover 12 is fitted to the opening at the side of the electronic component 2 of the shield case 4. This back cover 12 has an abutting portion formed at a position to abut against the leading end of the partition board 5, and this abutting portion is formed by projecting from the back cover 12 by drawing process or the like. A prior art relating to this application is disclosed, for example, in Japanese Laid-open Patent No. H8-37474.

In such conventional radio frequency apparatus, however, to prevent magnetic coupling of the coil 3 with the inductance element 3*b* formed in other circuit, the partition board 5 is formed in almost overall width of the frame body 4*a*, and any component cannot be mounted on the position of the partition board 5.

SUMMARY OF THE INVENTION

The invention is devised to solve these problems, and it is hence an object thereof to present a small-sized radio frequency apparatus capable of mounting components at high density by reducing the size of partition board so as to minimize the dead zone for mounting components.

To achieve the object, the radio frequency apparatus of the invention comprises a printed circuit board mounting electronic components including an inductance element, a metal frame body covering this printed circuit board and connected to the ground, a lid formed integrally with the frame body, covering the inductance element mounting side of the frame body, and a leg formed by cutting and bending from the lid, having a width nearly same as the width of the inductance element, in which the leg is disposed closely to the inductance element.

As a result, the inductance element is disposed closely to the leg having a width nearly same as the width of the inductance element, and the magnetic flux generated by this inductance element can be shielded by the leg.

Therefore, this inductance element is rarely coupled with other circuit, and the width of the leg is as narrow as the width of the inductance element, and the partition board can be reduced in size. As the partition board is reduced in size, the prohibition zone for mounting components due to partition board is smaller, so that a small-sized radio frequency apparatus is realized.

Further, since the magnetic field of the inductance element can be shielded by the leg, a plurality of coils can be disposed closely to each other, and a radio frequency apparatus of further smaller size is realized.

The shield case is integrally formed of frame body and lid, and hence the shield case may be obtained at low cost. Therefore, an inexpensive radio frequency apparatus can be realized. Moreover, since the lid, frame body and leg are integrally formed, management of components is easy, and assembling is easy. Hence, the number of processes is saved.

Since the lid, frame body and leg are integrally formed, the radio frequency resistance from the radio frequency circuit to the ground is small, and unnecessary inductance component is not provided.

Unlike the prior art, since there is no structure of elastic abutting of the cover and partition board, the conduction resistance is not changed by vibration, so that a stable shield is obtained.

In the radio frequency apparatus of the invention, the leg is disposed closely to the inductance element, and its leading end is connected to the ground terminal of the inductance element. As result, leakage magnetic flux generated from the wiring on the printed circuit board can be suppressed more effectively, and the magnetic flux of the inductance element can be shielded more securely.

Also in the radio frequency apparatus of the invention, the inductance element is disposed inside of bending of the leg. As a result, the upper side of the inductance element is closed. Therefore it is hardly influenced by undesired incoming radio waves, and radio frequency signals generated by the inductance element are not released to give adverse effects on other devices. Since the upper side is also shielded, the magnetic flux can be shielded more effectively, and a plurality of coils can be disposed more closely to each other.

Also in the radio frequency apparatus of the invention, the inductance element is disposed outside of bending of the leg. As a result, by forming the leg, the hole is formed above the inductance element. In this constitution, too, the magnetic field of the inductance element is shielded by the leg, and a sufficient shielding effect is obtained.

Also in the radio frequency apparatus of the invention, the inductance element is an air core coil. Since the inductance element is an air core coil, the air core coil can be adjusted by the hole formed by disposing the leg.

Also in the radio frequency apparatus of the invention, the inductance element is an air core coil, and the opening side of this air core coil and the bending side of the leg are opposite to each other. In this constitution, since the opening side of the air core coil is opposite to the inside of bending or outside of bending of the leg, the magnetic field generated by the air core coil can be shielded effectively.

Also in the radio frequency apparatus of the invention, an abutting portion is provided in a metal back cover covering the opposite direction of the lid side, and the leading end of the leg formed by penetrating through the printed circuit board abuts against this abutting portion. As a result, the ground of the coil as the inductance element can be grounded securely. Further, since the cover is provided at one side only, the gap of the coil and lid is not changed, and a stable shielding effect is obtained, so that an apparatus of stable performance is presented.

DESCRIPTION OF THE PREFERRED EMBODIMENTS

Figure 1:
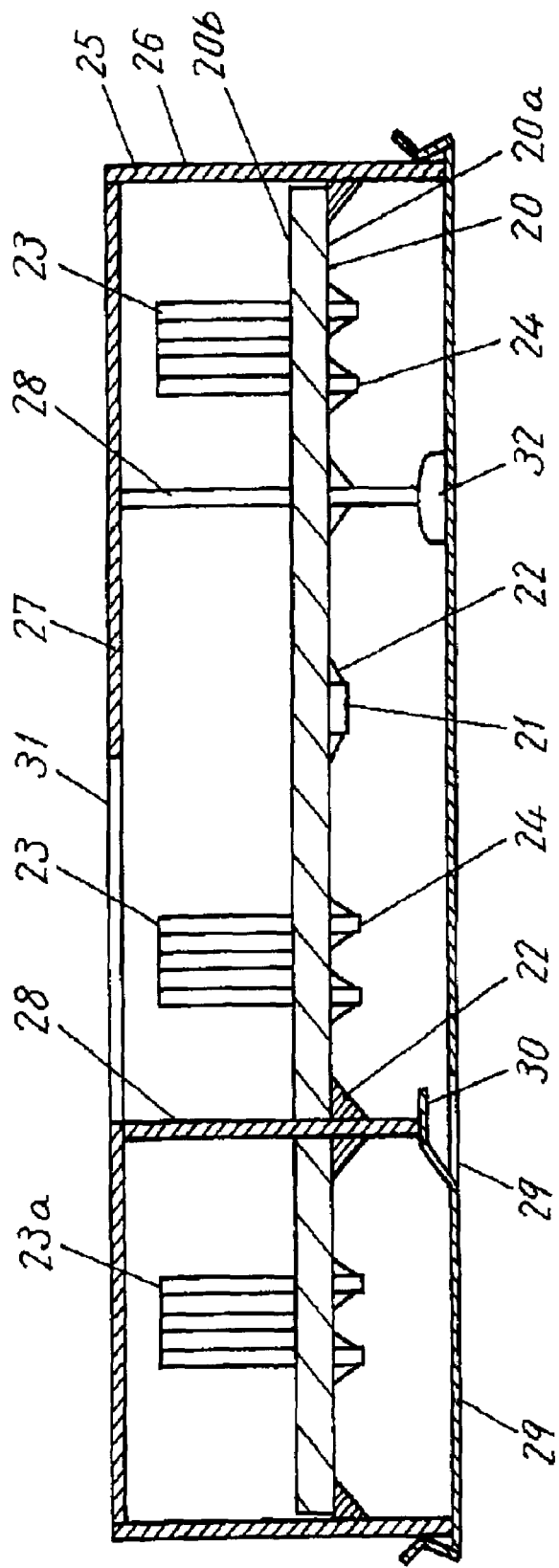
FIG. 1 is a side sectional view of radio frequency apparatus in a preferred embodiment of the invention.
Figure 3:
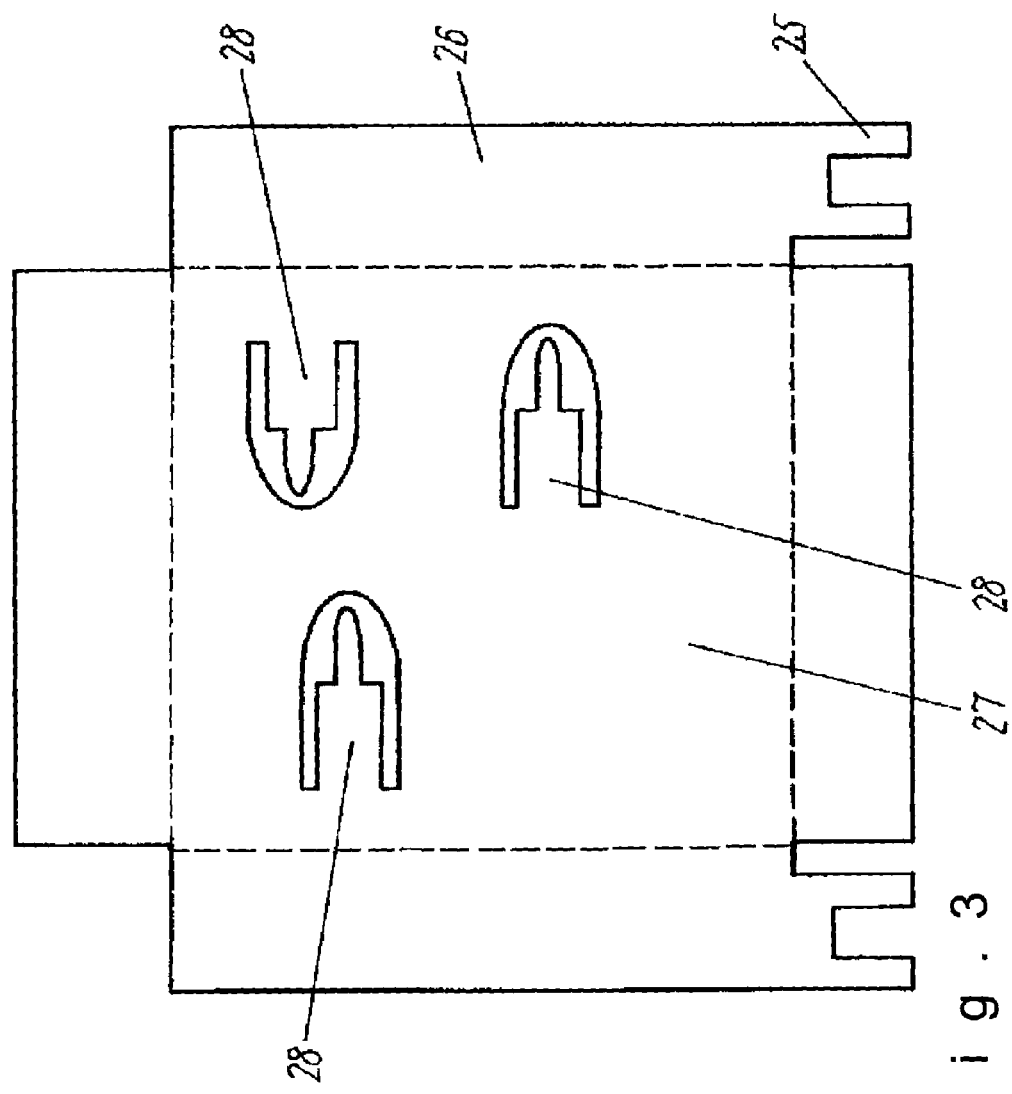
FIG. 3 is a development diagram of shield case in the preferred embodiment of the invention.
Figure 4:
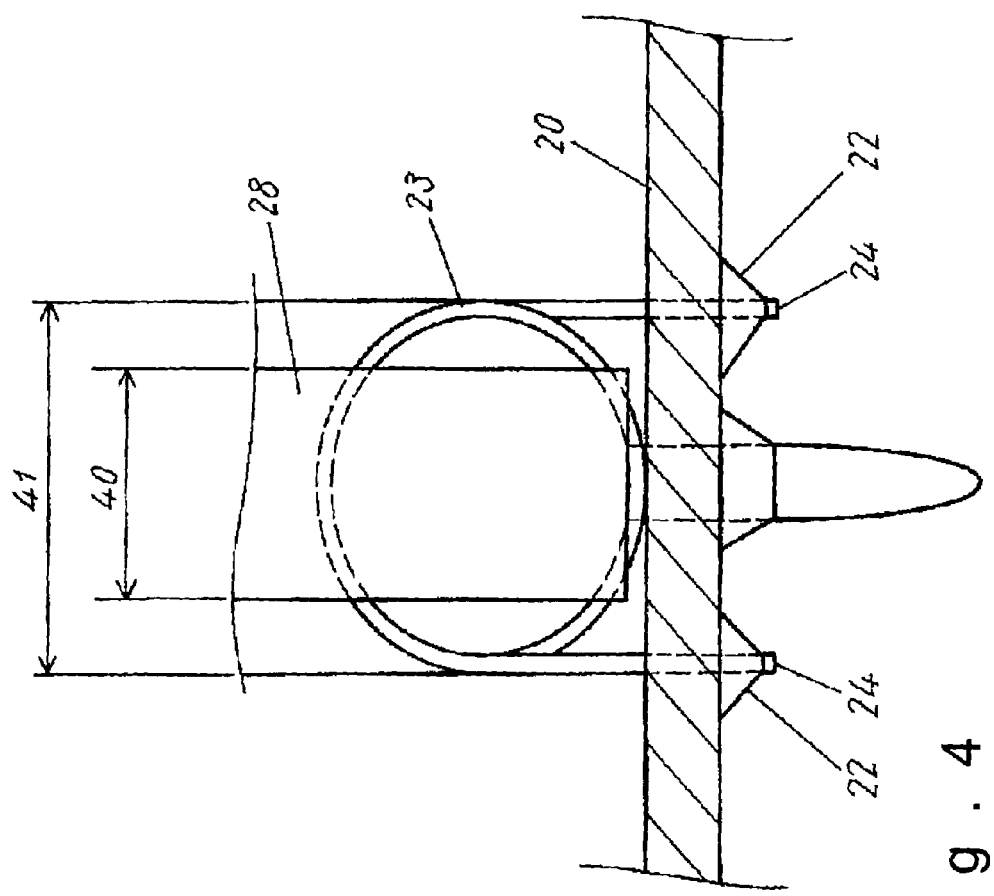
FIG. 4 is an essential detailed view in the preferred embodiment of the invention.
Figure 5:
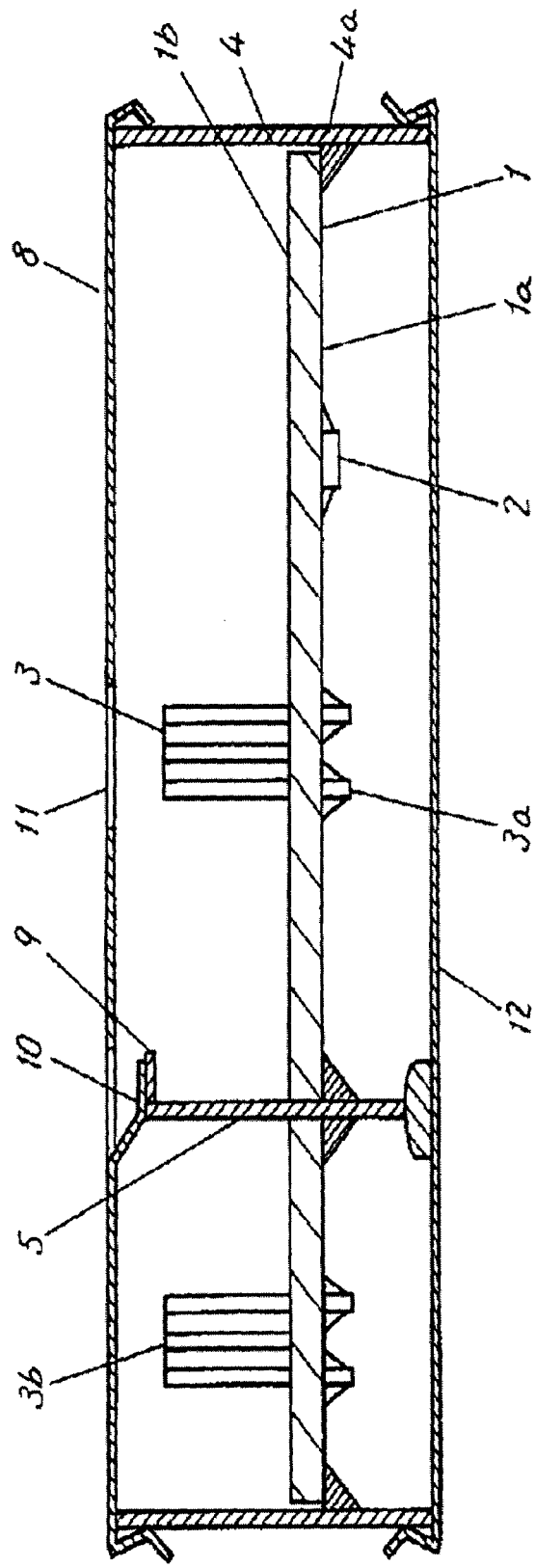
FIG. 5 is a side sectional view of a conventional radio frequency apparatus.
Figure 6:
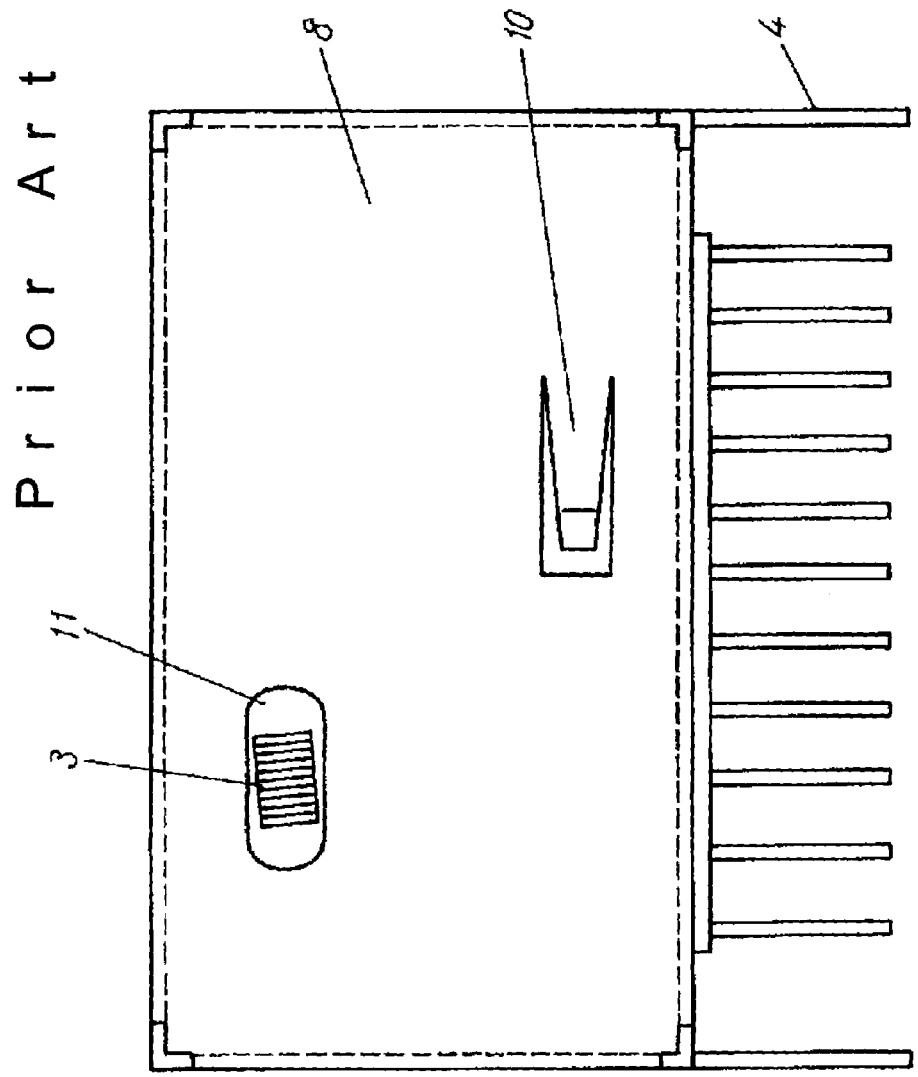
FIG. 6 is a top view of the conventional radio frequency apparatus.
Figure 7:
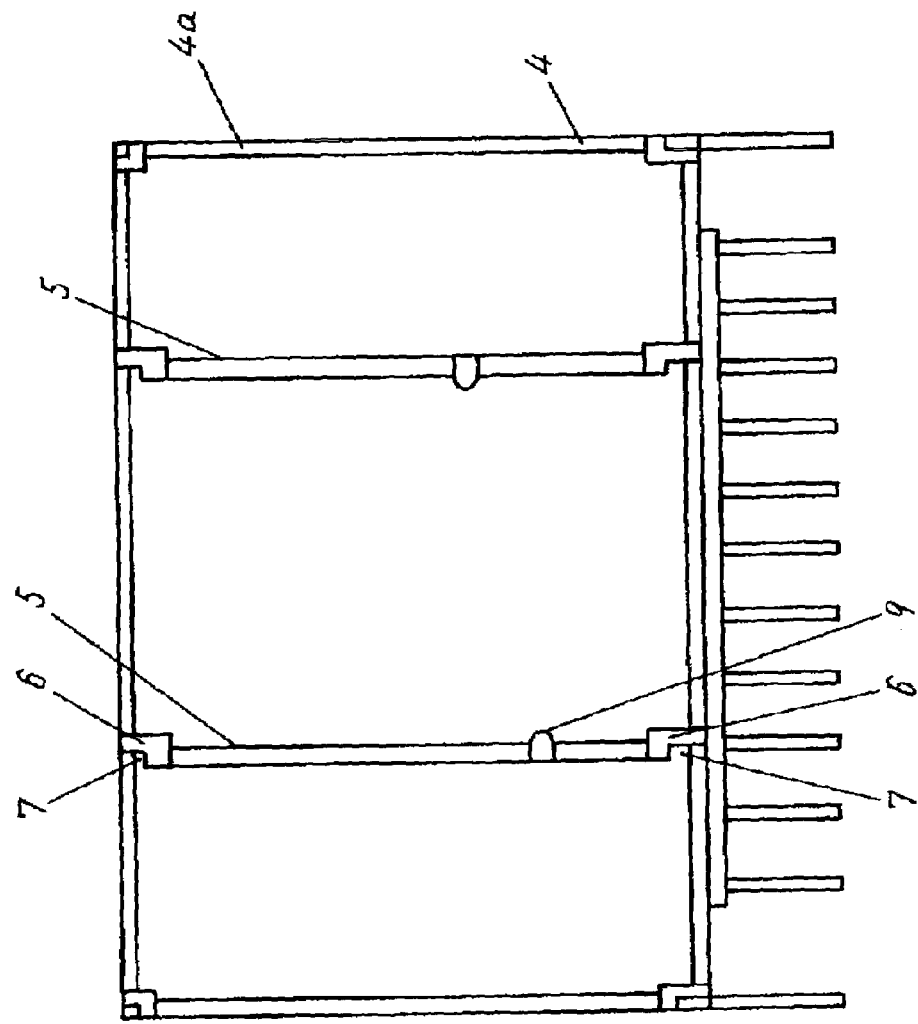
FIG. 7 is a top view of shield case in the conventional radio frequency apparatus.

Referring now to the drawings, preferred embodiments of the invention are described below. FIG. 1 is a side sectional view of radio frequency apparatus in a preferred embodiment of the invention, FIG. 2 is its top view, FIG. 3 is a development diagram of its shield case, and FIG. 4 is its essential detailed view.

Figure 2:
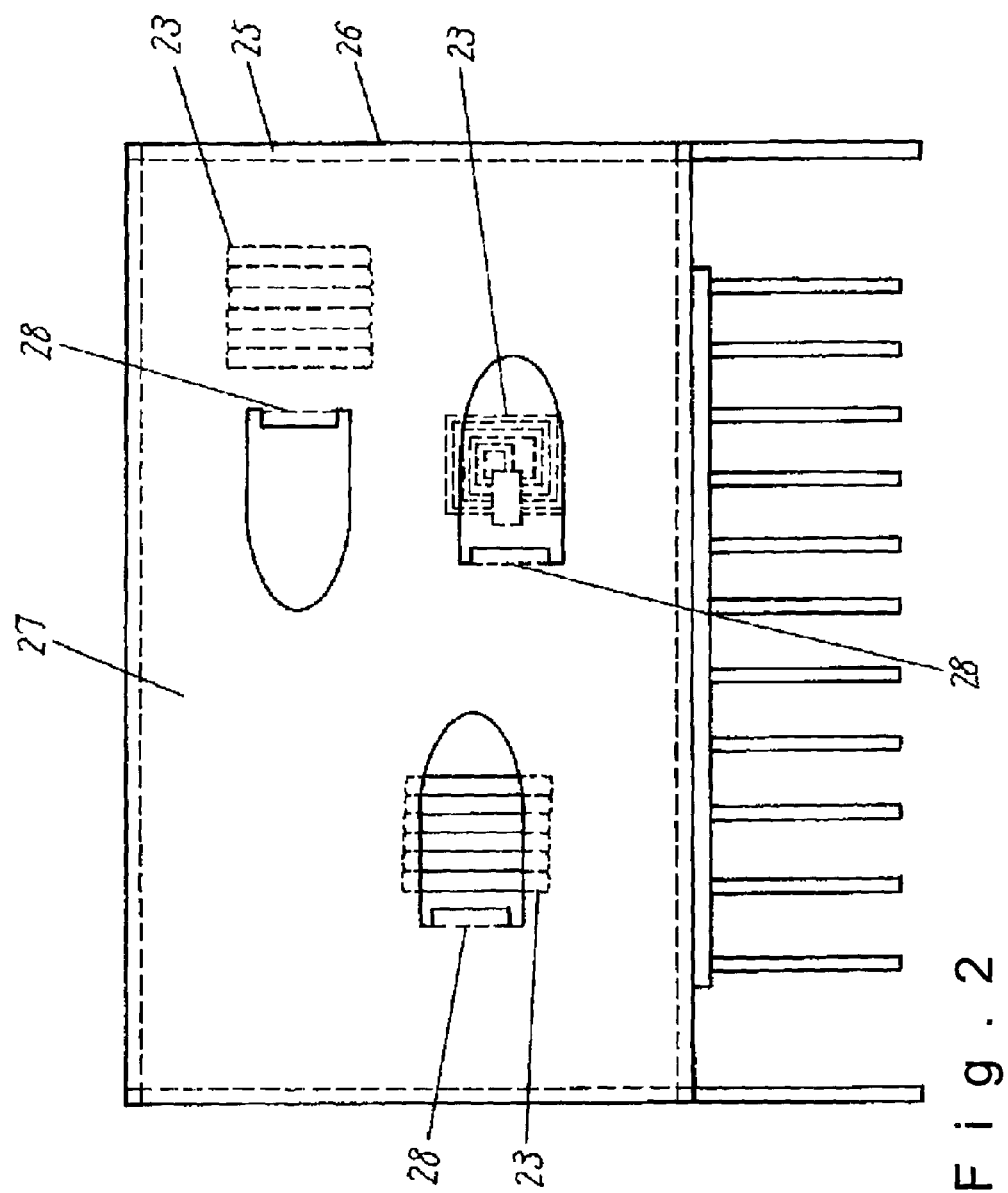
FIG. 2 is a top view of radio frequency apparatus in the preferred embodiment of the invention.

In FIG. 1 and FIG. 2, an electronic component 21 is mounted on one side 20a of a printed circuit board 20. The electronic component 21 is connected to the printed circuit board 20 by cream solder 22. On other side 20b of the printed circuit board 20, inductance elements such as air core coil 23 and coil 23a are mounted. Leads 24 of the coil 23 are inserted into holes provided in the printed circuit board 20, and connected to the printed circuit board 20 by cream solder 22. Thus, a radio frequency circuit preliminarily mounting the electronic component 21, coil 23 and others is formed in the printed circuit board 20.

The printed circuit board 20 forming such radio frequency circuit is placed in a metal shield case 25. The ground of the radio frequency circuit is soldered and connected to a frame body 26 forming the outer circumference of the shield case 25 at the peripheral edge of the printed circuit board 20.

The shield case 25 has a lid 27 so as to cover the side disposing the coil 23, and this lid 27 is formed integrally with the frame body 26. This lid 27 has a leg 28 formed integrally by cutting and bending from the lid 27, and a hole 31 is formed by this cutting and bending process. The leading end of the leg 28 penetrates through the printed circuit board 20, and is connected by solder 22 to the printed circuit board 20 at the mounting side of the electronic component 21.

On the other hand, at the mounting side of the electronic component 21, a back cover 29 is provided for covering the open side of the shield case 25. The back cover 29 has an elastic contact pawl 30 and an abutting portion 32. When the elastic contact pawl 30 and abutting portion 32 abut against the leading end of the leg 28, the open side is shielded.

An essential detailed drawing of FIG. 4 shows the relation of position and size of the leg 28 and coil 23. In the preferred embodiment, as shown in FIG. 4, the width 40 of the leg 28 is nearly same as the diameter 41 of the coil 23. The leg 28 is disposed opposite and close to the opening side of the coil 23. That is, the leg 28 is disposed so as to be vertical and close to the direction of generation of magnetic flux from the coil 23.

The vicinal area of the opening side of the coil 23 is a region of concentration of magnetic flux generated from the coil 23 and high density of magnetic flux. In the region of high density of magnetic flux such as the vicinal area of the opening side of the coil 23 is higher in the effect of shielding the magnetic flux by a shield plate of a smaller area as compared with the region of widely spread magnetic flux. The radio frequency apparatus of the invention realizes an efficient and high shielding effect by the leg 28 of small area by disposing the leg 28 integrally with the shield case 25.

It is more effective when the ground of the circuit composed of the coil 23 is connected to the leg 28 disposed opposite and closely to the coil 23. That is, leakage magnetic flux generated from the wiring on the printed circuit board is suppressed more effectively. As a result, the magnetic flux of the coil 23 can be shielded securely.

Therefore, despite the width 40 of the leg 28 is nearly same as the diameter 41 of the coil, the magnetic flux can be shielded securely. Hence, magnetic coupling with the coil 23a composing other circuit or the like can be prevented, and the coils can be disposed closely to each other in a short distance. Moreover, since the width of the partition board itself is reduced, the dead area not allowed to mount the electronic component 21, coil 23, and other components can be decreased. That is, the leg 28 serves as the partition board, and the space for disposing the components and others can be kept more flexibly. Therefore, a small-sized radio frequency apparatus can be realized.

In the preferred embodiment, since the shield case 25 is an integral structure composed of the frame body 26, lid 27 and leg 28, faulty contact or other trouble is not caused by vibration or the like, and grounding can be maintained stably. Further, since the gap of the coil 23 and lid 27 is not changed, for example, the resonance frequency of a resonant circuit does not fluctuate. Hence, according to the preferred embodiment, a stable shielding effect is obtained, and a radio frequency apparatus of stable performance is obtained. For example, when an oscillation circuit is composed of this coil 23, fluctuations of its oscillation waveforms can be reduced. Further, since the frame body 26, lid 27 and leg 28 can be formed simultaneously by pressing or other process, the shield case is manufactured at low cost, and an inexpensive radio frequency apparatus can be realized.

The cover is the back cover at one side only, and it is easy to assemble, and the number of assembling steps is curtailed.

The coil 23 may be disposed outside of bending of the leg 28. In this case, the coil 23 is disposed beneath the hole 31 formed by cutting and bending of the leg 28. As a result, the wire interval for forming the coil 23 can be varied through the hole 31, and this hole 31 can be used also as an adjustment hole.

Or the other hand, coil 23 may be disposed inside of bending of the leg 28. In this case, there is no hole above the coil 23, and the magnetic flux of the coil 23 can be shield more securely, and coupling with other coil rarely occurs, and undesired incoming signal or leak hardly takes place.

In the preferred embodiment, the inductance element is an air core coil, but a chip inductor or pattern coil may be used. In this case, too, coupling with other inductance element can be reduced.

Generally, the Q value of the chip inductor or pattern coil is lower than in the air core coil, and it is likely to receive effects of the nearby metal plate or the like. In the preferred embodiment, however, since the width 40 of the leg 28 is nearly same as the width 41 of the inductance element, the radio frequency resistance component is very low, and the Q value of the pattern inductance or chip inductance by this leg 28 is hardly lowered. This property is very important for maintaining the selectivity or lowering the filter loss when composing a tuning filter or the like by using these inductance elements. According to the constitution of the preferred embodiment, a favorable filter can be obtained also by using pattern inductance or chip inductance as the inductance elements.

The invention presents a radio frequency apparatus comprising a printed circuit board mounting electronic components including an inductance element, a metal frame body covering this printed circuit board and connected to the ground, a lid formed integrally with the frame body, covering the inductance element mounting side of the frame body, and a leg formed by cutting and bending from the lid, having a width nearly same as the width of the inductance element, in which the leg is disposed closely to the inductance element.

Therefore, since the magnetic flux generated by the inductance element can be shielded by the leg, the width of the leg can be formed nearly same as the width of the inductance element, and the components can be disposed efficiently, so that a small-sized radio frequency apparatus can be obtained.

What is claimed is:

1. A radio frequency apparatus comprising:
   a printed circuit board mounting electronic components including an inductance element,
   a metal frame body covering this printed circuit board and connected to the ground,
   a lid formed integrally with the frame body, covering the inductance element mounting side of the frame body, and
   a leg formed by cutting and bending from the lid, having a width nearly same as the width of the inductance element,
   wherein said leg is disposed closely to the inductance element.

2. The radio frequency apparatus of claim 1, wherein said leg is disposed closely to the inductance element, and its leading end is connected to the ground terminal of the inductance element.

3. The radio frequency apparatus of claim 2, wherein said inductance element is disposed inside of bending of the leg.

4. The radio frequency apparatus of claim 3, wherein said inductance element is formed of an air core coil, and the opening side of the air core coil is disposed opposite to the bending side of the leg.

5. The radio frequency apparatus of claim 4, wherein an abutting portion is provided in a metal back cover covering in the opposite direction of the lid side, and the leading end of the leg formed by penetrating through the printed circuit board abuts against this abutting portion.

6. The radio frequency apparatus of claim 2, wherein said inductance element is disposed outside of bending of the leg.

7. The radio frequency apparatus of claim 6, wherein said inductance element is an air core coil.

8. The radio frequency apparatus of claim 7, wherein said inductance element is formed of an air core coil, and the opening side of the air core coil is disposed opposite to the bending side of the leg.

9. The radio frequency apparatus of claim 8, wherein an abutting portion is provided in a metal back cover covering in the opposite direction of the lid side, and the leading end of the leg formed by penetrating through the printed circuit board abuts against this abutting portion.

10. The radio frequency apparatus of claim 6, wherein said inductance element is formed of an air core coil, and the opening side of the air core coil is disposed opposite to the bending side of the leg.

11. The radio frequency apparatus of claim 10, wherein an abutting portion is provided in a metal back cover covering in the opposite direction of the lid side, and the leading end of the leg formed by penetrating through the printed circuit board abuts against this abutting portion.

12. The radio frequency apparatus of claim 2, wherein said inductance element is formed of an air core coil, and the opening side of the air core coil is disposed opposite to the bending side of the leg.

13. The radio frequency apparatus of claim 12, wherein an abutting portion is provided in a metal back cover covering in the opposite direction of the lid side, and the leading end of the leg formed by penetrating through the printed circuit board abuts against this abutting portion.

14. The radio frequency apparatus of claim 1, wherein said inductance element is formed of an air core coil, and the opening side of the air core coil is disposed opposite to the bending side of the leg.

15. The radio frequency apparatus of claim 14, wherein an abutting portion is provided in a metal back cover covering in the opposite direction of the lid side, and the leading end of the leg formed by penetrating through the printed circuit board abuts against this abutting portion.

* * * * *